US008741070B2

(12) United States Patent
Mizutani et al.

(10) Patent No.: US 8,741,070 B2
(45) Date of Patent: Jun. 3, 2014

(54) LIQUID PROCESSING METHOD, LIQUID PROCESSING APPARATUS AND RECORDING MEDIUM

(75) Inventors: Nobutaka Mizutani, Nirasaki (JP); Tsutae Omori, Nirasaki (JP); Takehiko Orii, Nirasaki (JP); Akira Fujita, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 202 days.

(21) Appl. No.: 13/328,058

(22) Filed: Dec. 16, 2011

(65) Prior Publication Data

US 2012/0160273 A1 Jun. 28, 2012

(30) Foreign Application Priority Data

Dec. 22, 2010 (JP) ................................. 2010-285921

(51) Int. Cl.
*B08B 3/04* (2006.01)
(52) U.S. Cl.
USPC .......... 134/26; 134/2; 134/3; 134/27; 134/34; 134/36; 134/42; 134/902; 438/745; 438/748; 438/753; 438/754; 438/759; 216/92; 216/96; 216/99; 216/100
(58) Field of Classification Search
USPC ........ 216/92, 96, 99–101; 438/745, 748, 753, 438/754, 759; 134/2, 3, 26, 27, 34, 36, 42, 134/902
See application file for complete search history.

(56) References Cited

U.S. PATENT DOCUMENTS

| 7,749,909 B2 * | 7/2010 | Tomita et al. ................. 438/694 |
| 2006/0003601 A1 * | 1/2006 | Sugeta et al. ................. 438/781 |
| 2009/0311874 A1 * | 12/2009 | Tomita et al. ................. 438/759 |
| 2010/0240219 A1 * | 9/2010 | Tomita et al. ................. 438/706 |
| 2011/0162680 A1 * | 7/2011 | Saito et al. ....................... 134/26 |

FOREIGN PATENT DOCUMENTS

| JP | 2002-134464 A | 5/2002 |
| JP | 2006-191008 A | 7/2006 |
| JP | 2008-041722 A | 2/2008 |
| JP | 2010-114414 A | 5/2010 |

* cited by examiner

*Primary Examiner* — Bibi Carrillo
(74) *Attorney, Agent, or Firm* — Abelman, Frayne & Schwab (57) ABSTRACT

Disclosed are a liquid processing method, a liquid processing apparatus, and a recording medium that can prevent convex portions of a target substrate from collapsing when a rinsing liquid is dried. A base surface of a target substrate is hydrophilized and the surfaces of convex portions become water-repellent by surface-processing the target substrate which includes a main body, a plurality of convex portions protruding from the main body, and a base surface formed between the convex portions on the substrate main body. Next, a rinsing liquid is supplied to the target substrate which has been subjected to the surface processing. Thereafter, the rinsing liquid is removed from the target substrate.

7 Claims, 12 Drawing Sheets

LIQUID PROCESSING METHOD, LIQUID PROCESSING APPARATUS AND RECORDING MEDIUM

CROSS-REFERENCE TO RELATED APPLICATIONS

This application is based on and claims priority from Japanese Patent Application No. 2010-285921, filed on Dec. 22, 2010, with the Japanese Patent Office, the disclosure of which is incorporated herein in its entirety by reference.

TECHNICAL FIELD

The present disclosure relates to a liquid processing method, a liquid processing apparatus, and a recording medium.

BACKGROUND

In the related art, a liquid processing method has been known in which a rinsing liquid such as deionized water (DIW) is supplied onto a target substrate (object to be processed) where a plurality of minute convex portions are formed as fine patterns on the surface of a substrate main body (main body) and the target substrate is dried after supplying the rinsing liquid. However, in the conventional liquid processing method, when the rinsing liquid supplied to the target substrate is dried, the surface tension of the rinsing liquid is applied between the convex portions protruding from the substrate main body. As a result, adjacent convex portions are tensioned therebetween and may collapse.

A technology of cleaning a target substrate has been known using a chemical liquid, removing the chemical liquid using DIW, and forming a water-repellent protective layer on the surface of the target substrate in order to prevent the convex portions from collapsing (see, for example, Japanese Patent No. 4403202).

However, in the case where the surface (base surface) of a substrate main body and the surfaces of convex portions become are fully water-repellent, when a drying process is performed, a rinsing liquid is not always uniformly dried on the surface of a target substrate and a portion where the rinsing liquid is dried and a portion wet with the rinsing liquid may coexist according to, for example, a pattern shape of the convex portions. In this case, the surface tension of the rinsing liquid applied to the convex portions on the main body of the substrate loses its balance between the portion where the rinsing liquid is dried and the portion wet with the rinsing liquid, and as a result, there is a concern that the convex portions may collapse.

SUMMARY

An exemplary embodiment of the present disclosure provides a liquid processing method of processing an object to be processed which includes a main body, a plurality of convex portions protruding from the main body, and a base surface formed between the convex portions on the main body, the method comprising: supplying a chemical liquid to the object to be processed; su plyin a rinsing liquid to the object to be processed thereby removing the chemical liquid from the object to be processed; after removing the chemical liquid from the object to be processed, processing a surface of the object to be processed such that the base surface of the object to be processed which is water-repellent becomes selectively hydrophilic and the surfaces of the convex portions which are hydrophilic become selectively water-repellent; supplying a rinsing liquid to the object to be processed which has been subjected to the surface processing; and removing the rinsing liquid from the object to be processed thereby drying the object to be processed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing method, a liquid processing apparatus, and a recording medium that can prevent the portion where the rinsing liquid is dried and the portion wet with the rinsing liquid from coexisting when drying the rinsing liquid to prevent the convex portions from collapsing.

A first exemplary embodiment of the present disclosure provides a liquid processing method of processing an object to be processed which includes a main body, a plurality of convex portions protruding from the main body and a base surface formed between the convex portions on the main body, the method including: processing a surface of the object so that the base surface of the object becomes hydorphilized and the surfaces of the convex portions become water-repellent; supplying a rinsing liquid to the object which has been subjected to the surface processing; and drying the object by removing the rinsing liquid from.

In the liquid processing method of the first exemplary embodiment, the surface processing includes supplying the object with a hydrophilizing liquid that hydrophilizes the water-repellent base surface of the object. Further, the surface processing includes supplying the object with a water-repellent liquid making the hydrophilic surfaces of the convex portions to be water-repellent. Still further, the surface processing operation includes supplying the object with a hydrophilizing and water-repellent liquid thereby hydrophilizing the water-repellent base surface and making the hydrophilic surfaces of the convex portions to be water-repellent simultaneously. In the meantime, each of the convex portions of the object has a cylindrical shape. The base surface is made of an Si-based material and each of the convex portions is made of a metallic material.

A second exemplary embodiment of the present disclosure provides a liquid processing apparatus of processing an object to be processed which includes a main body, a plurality of convex portions protruding from the main body and a base surface formed between the convex portions on the main body, the apparatus including: a substrate holding mechanism configured to hold the object; a surface processing mechanism configured to perform surface-processing for the object held by the substrate holding mechanism; a rinsing liquid supplying mechanism configured to supply a rinsing liquid to the object; and a controller configured to control the surface processing mechanism and the rinsing liquid supplying mechanism. The controller controls the surface processing mechanism so that the base surface of the object is hydrophilized and the surfaces of the convex portions become water-repellent, and controls the rinsing liquid supplying mechanism to supply the rinsing liquid to the object which has been subjected to the surface processing by the surface processing mechanism.

In the liquid processing apparatus of the second exemplary embodiment, the substrate holding mechanism rotatably holds the object and the controller controls the substrate holding mechanism to rotate the substrate holding mechanism, thereby removing the rinsing liquid from the object. The surface processing mechanism includes a hydrophilizing liquid supplying mechanism configured to supply a hydrophilizing liquid to the object so that the water-repellent base surface becomes hydrophilic. Further, the surface processing apparatus includes a water-repellent liquid supplying mechanism configured to supply a water-repellent liquid to the object so that the hydrophilic surfaces of the convex portions become water-repellent. Still further, the surface processing mechanism includes a hydrophilizing and water-repellent liquid supplying mechanism configured to supply a hydrophilizing and water-repellent liquid to the object so that the water-repellent base surface becomes hydrophilic and the hydrophilic surfaces of the convex portions become water-repellent simultaneously. In the meantime, each of the convex portions of the object has a cylindrical shape. The base surface is made of an Si-based material and each of the convex portions is made of a metallic material.

A third exemplary embodiment of the present disclosure provides a computer-readable recording medium storing a computer program for controlling a liquid processing apparatus to execute a liquid processing method that processes an object to be processed including a main body, a plurality of convex portions protruding from the main body and a base surface formed between the convex portions on the main body, the method comprising: processing a surface of the object so that the base surface of the object becomes hydorphilized and the surfaces of the convex portions become water-repellent; supplying a rinsing liquid to the object which has been subjected to the surface processing; and drying the object by removing the rinsing liquid from the object.

According to the exemplary embodiments of the present disclosure, a base surface of an object is hydrophilized and the surfaces of the convex portions become water-repellent by performing the surface-processing of the object by the surface-processing mechanism before supplying a rinsing liquid to the object. As a result, it is possible to prevent the portion where the rinsing liquid is dried and the portion wet with the rinsing liquid from coexisting on the surface of the object when removing the rinsing liquid from the object, thereby preventing the convex portions from collapsing.

Hereinafter, an exemplary embodiment of the present disclosure will be described with reference to FIGS. 1 to 7.

Configuration of an Object to be Processed

Figure 1A:
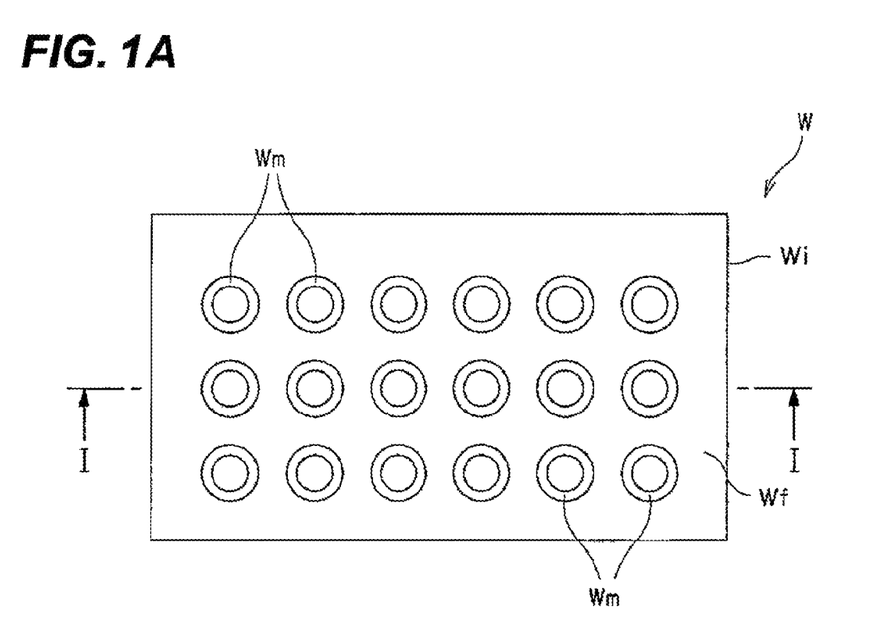
FIG. 1A-1B is a diagram illustrating a target substrate (object to be processed) which is used in a liquid processing method according to an exemplary embodiment of the present disclosure.
Figure 1B:
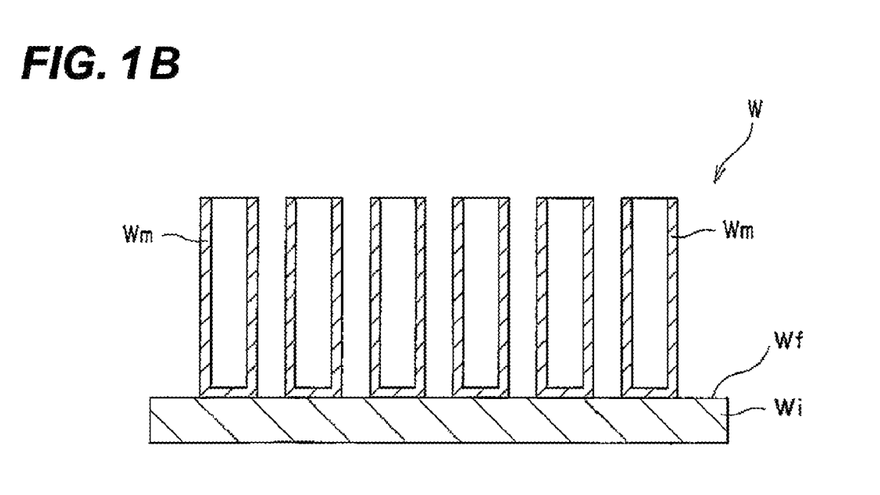

First, with reference to FIGS. 1A and 1B, the configuration of a target substrate (object to be processed) used in a liquid processing method according to an exemplary embodiment of the present disclosure is described. FIG. 1A is a schematic plan view illustrating a part of a target substrate and FIG. 1B is a schematic cross-sectional view (taken along the line I-I of FIG. 1A) illustrating a part of the target substrate.

As shown in FIGS. 1A and 1B, a target substrate (object) W used in the liquid processing method according to the exemplary embodiment of the present disclosure includes a flat panel shaped substrate main body (main body) $W_i$ and a plurality of convex portions $W_m$ protruding on substrate main body $W_i$. Each convex portion $W_m$ is formed on substrate main body $W_i$ in a predetermined pattern, and specifically, has a cylindrical shape. As shown in FIG. 1A, convex portions $W_m$ are arranged with a predetermined gap vertically and horizontally when seen from the top.

A base surface $W_f$ is formed between convex portions $W_m$ on substrate main body $W_i$. Examples of a material constituting base surface $W_f$ of substrate main body $W_i$ may include Si-based material such as SiN, Si, and $SiO_2$, and examples of a material constituting convex portions $W_m$ may include a metallic material such as TiN (Titan nitride), W (tungsten), Hf (hafnium), and Poly-Si. Hereinafter, base surface $W_f$ of substrate main body $W_i$ is originally made of a water-repellent material (for example, SiN) and the surface of convex portions $W_m$ (for example, TiN) is made of a material having a hydrophilic property, but the materials are not limited thereto. An example of target substrate W may include a target substrate such as a semiconductor wafer, but is not limited thereto.

Configuration of a Liquid Processing Apparatus

Figure 2:
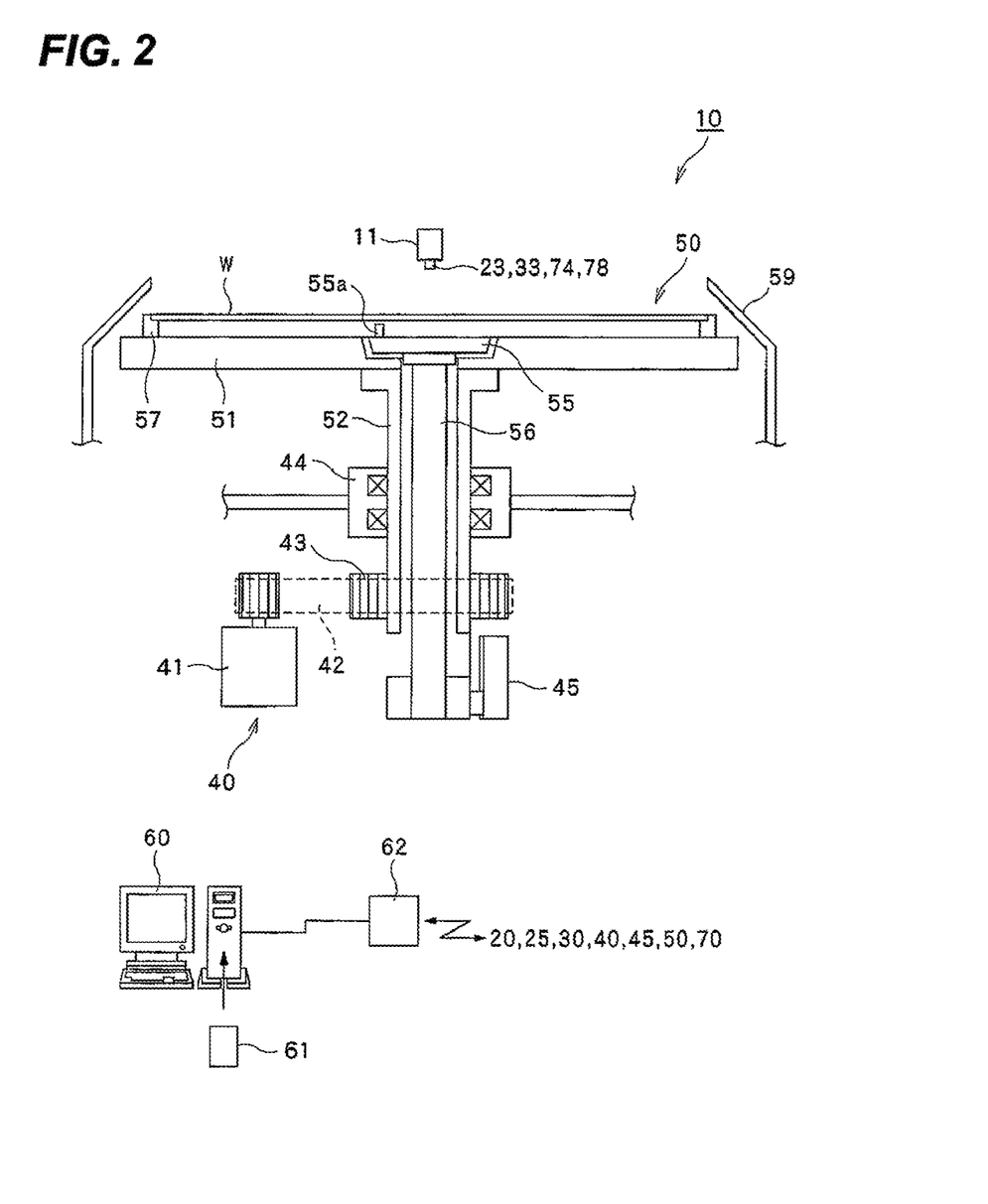
FIG. 2 is a lateral cross-sectional view illustrating the configuration of a liquid processing apparatus according to an exemplary embodiment of the present disclosure.
Figure 3:
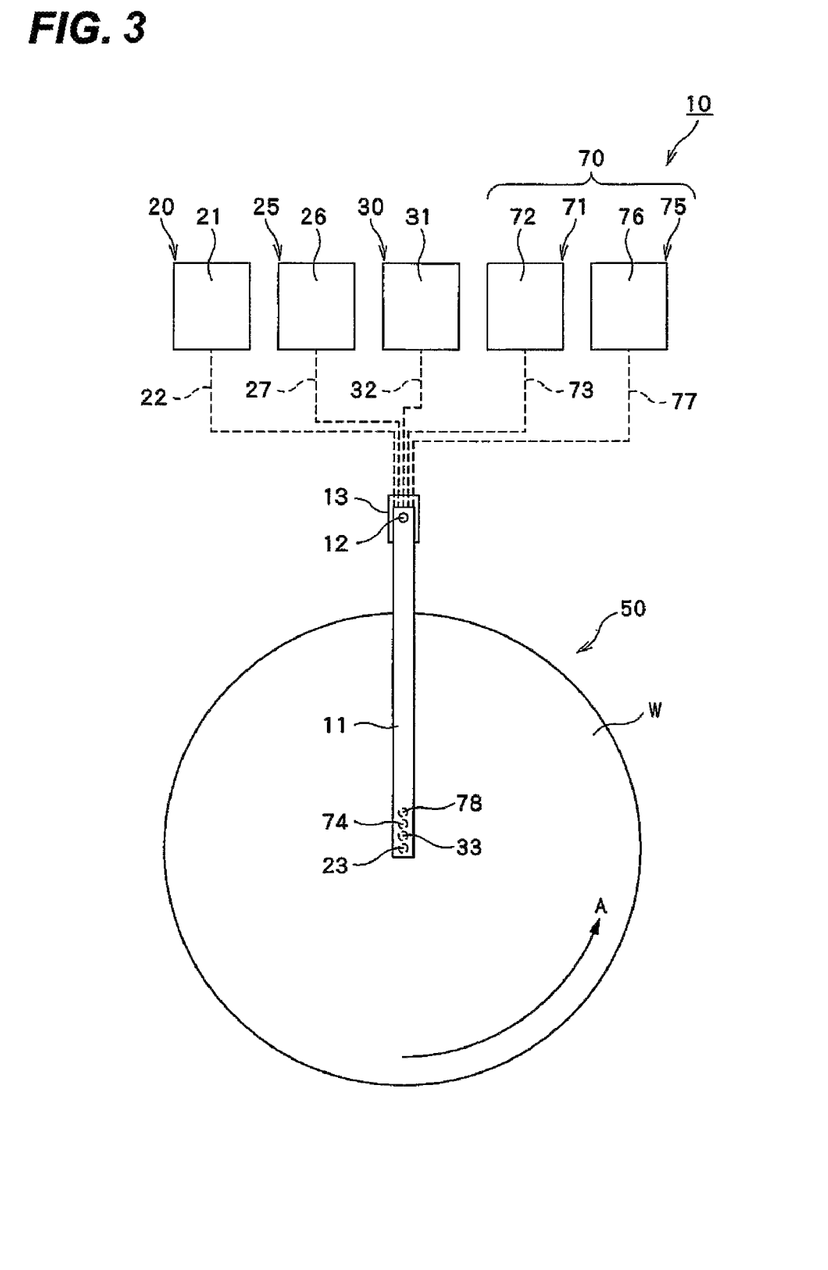
FIG. 3 is a top view illustrating the configuration of a liquid processing apparatus according to an exemplary embodiment of the present disclosure.

Next, the configuration of a liquid processing apparatus according to the exemplary embodiment of the present disclosure is described with reference to FIGS. 2 and 3. FIGS. 2 and 3 illustrate a liquid processing apparatus according to the exemplary embodiment of the present disclosure.

As illustrated in FIG. 2, a liquid processing apparatus 10 includes a substrate holding mechanism 50 rotatably holding a target substrate W. Substrate holding mechanism 50 includes a hollow-shaped support plate 51 and a support portion 57 which is installed on hollow-shaped support plate 51 to hold and support substrate main body $W_i$ of target substrate W.

A hollow-shaped rotational shaft 52 extended vertically is connected to a bottom surface of hollow-shaped support plate 51. A lift pin plate 55 having a lift pin 55a is disposed in a hollow of support plate 51, in which lift pin 55a may be contacted with a rear surface (bottom surface) of substrate main body $W_i$ of target substrate W. A lift shaft 56 which is vertically extended in a hollow of hollow-shaped rotational shaft 52 is connected to a bottom surface of lift pin plate 55.

A lift driving unit 45 is installed at a lower end portion of lift shaft 56 to move lift shaft 56 vertically. A cup 59 is installed outside a peripheral border of support plate 51 to obliquely cover a peripheral border of target substrate W supported by support portion 57 and an upper side thereof. A single lift pin 55a is shown in FIG. 2, but three lift pins 55a are actually installed on lift pin plate 55.

As shown in FIG. 2, the liquid processing apparatus further includes a rotation driving mechanism 40 having a pulley 43 disposed outside a peripheral border of rotational shaft 52 and a motor 41 supplying driving force to pulley 43 through a driving belt 42.

Rotation driving mechanism 40 rotates support portion 57 around rotational shaft 52 with rotating rotational shaft 52 by motor 41, and consequently, rotates target substrate W held and supported by support portion 57 of substrate holding mechanism 50. A bearing 44 is disposed outside the peripheral border of rotational shaft 52.

As shown in FIG. 3, liquid processing apparatus 10 includes a chemical liquid supplying mechanism 20, a rinsing liquid supplying mechanism 25, and a substitution accelerating liquid supplying mechanism 30 supplying a chemical liquid, a rinsing liquid, and a substitution accelerating liquid to target substrate W held by substrate holding mechanism 50, respectively. Liquid processing apparatus 10 further includes a surface processing mechanism 70 by which the base surface of target substrate W (Si-based material, for example, SiN) is hydrophilized for the rinsing liquid and the surfaces of the convex portions (metallic material, for example, TiN) become water-repellant for the rinsing liquid.

Chemical liquid supplying mechanism 20 supplies a chemical liquid to target substrate W supported by support portion 57 of substrate holding mechanism 50. Chemical, liquid supplying mechanism 20 includes a chemical liquid supplying unit 21 supplying the chemical liquid, a chemical liquid supplying pipe 22 guiding the chemical liquid supplied from chemical liquid supplying unit 21, and a liquid supplying nozzle 23 ejecting the chemical liquid from chemical liquid supplying pipe 22 to target substrate W. A portion of chemical liquid supplying pipe 22 passes through a liquid supplying arm 11, and liquid supplying nozzle 23 is installed at an end of liquid supplying arm 11. Examples of the chemical liquid used in the exemplary embodiment may include diluted hydrofluoric acid (DHF), sulfuric acid peroxide mixture (SPM), and ammonia hydrogen peroxide mixture (SC1), but are not limited thereto.

Rinsing liquid supplying mechanism 25 supplies the rinsing liquid to target substrate W and includes a rinsing liquid supplying unit 26 and a rinsing liquid supplying pipe 27 guiding the rinsing liquid supplied from rinsing liquid supplying unit 26. Liquid supplying nozzle 23 is connected at an end of rinsing liquid supplying pipe 27. A portion of rinsing liquid supplying pipe 27 passes through liquid supplying arm 11. An example of the rinsing liquid used in the exemplary embodiment may include DIW, but is not limited thereto.

Substitution accelerating liquid supplying mechanism 30 supplies a substitution accelerating liquid to target substrate W and includes a substitution accelerating liquid supplying unit 31, a substitution accelerating liquid supplying pipe 32 guiding the substitution accelerating liquid supplied from substitution accelerating liquid supplying unit 31, and a substitution accelerating liquid supplying nozzle 33 connected to an end of substitution accelerating liquid supplying pipe 32. A portion of substitution accelerating liquid supplying pipe 32 passes through liquid supplying arm 11. Examples of the substitution accelerating liquid used in the exemplary embodiment may include amphiphilic liquids such as isopropyl alcohol (IPA), propylene glycol monomethyl ether acetate (PGMEA), and hydro fluoro ether (HFE), but are not limited thereto.

As shown in FIG. 3, surface processing mechanism 70 includes a hydrophilizing liquid supplying mechanism 71 and a water-repellent liquid supplying mechanism 75.

Hydrophilizing liquid supplying mechanism 71 supplies a hydrophilizing liquid for hydrophilizing water-repellent base surface $W_f$ of target substrate W and includes a hydrophilizing liquid supplying unit 72 supplying the hydrophilizing liquid, a hydrophilizing liquid supplying pipe 73 guiding the hydrophilizing liquid supplied from hydrophilizing liquid supplying unit 72, and a hydrophilizing liquid supplying nozzle 74 connected to hydrophilizing liquid supplying pipe 73 and installed at the end of liquid supplying arm 11. A portion of hydrophilizing liquid supplying pipe 73 passes through liquid supplying arm 11. Examples of the hydrophilizing liquid used in the exemplary embodiment may include a chemical liquid containing ozonized water or a chemical liquid containing SPM, but are not limited thereto.

Water-repellent liquid supplying mechanism 75 supplies a water-repellent liquid for making the hydrophilic surfaces of convex portions $W_m$ of target substrate W to be water-repellent and includes a water-repellent liquid supplying unit 76 supplying the water-repellent liquid, a water-repellent liquid supplying pipe 77 guiding the water-repellent liquid supplied from water-repellent liquid supplying unit 76, and a water-repellent liquid supplying nozzle 78 connected to water-repellent liquid supplying pipe 77 and installed at the end of liquid supplying arm 11. A portion of water-repellent liquid supply pipe 77 passes through liquid supplying arm 11. Examples of the water-repellent liquid used in the exemplary embodiment may include a silylation agent such as dimethylamino trimethylsilane (TMSDMA), dimethyl(dimethylamino)silane (DMSDMA), 1,1,3,3-tetramethyl disilane (TMDS), and hexamethyldisilazane (HMDS), a chemical liquid containing fluoric polymer, or a chemical liquid containing a surfactant or the like, but are not limited thereto.

As shown in FIG. 3, liquid processing apparatus 10 includes a liquid supplying arm moving unit 13 moving horizontally liquid supplying arm 11 around a pivot shaft 12 (a direction perpendicular to rotational shaft 52). As shown in FIG. 2, liquid processing apparatus 10 includes a controller 62 controlling liquid processing apparatus 10, in particular, chemical liquid supplying mechanism 20, rinsing liquid supplying mechanism 25, substitution accelerating liquid supplying mechanism 30, rotation driving mechanism 40, lift driving unit 45, substrate holding mechanism 50, and surface processing mechanism 70.

Meanwhile, in the exemplary embodiment, a computer program for executing a liquid processing method to be described below in liquid processing apparatus 10 is stored in a recording medium 61 (see, for example, FIG. 2). The liquid processing apparatus' further includes a computer 60 receiving recording medium 61. Controller 62 is configured to receive a signal from computer 60 to control the liquid processing apparatus (more specifically, chemical liquid supplying mechanism 20, rinsing liquid supplying mechanism 25, substitution accelerating liquid supplying mechanism 30, rotation driving mechanism 40, lift driving unit 45, substrate holding mechanism 50, surface processing mechanism, or the like). Recording medium 61 in the present disclosure refers to a recording medium storing a computer program executed in a computer, for example, CD, DVD, MD, hard disk, and RAM.

Liquid Processing Method Using the Liquid Processing Apparatus

Next, the operation of the exemplary embodiment configured as described above, specifically, a liquid processing method using the liquid processing apparatus described above will be described. Each operation described below is controlled by controller 62.

First, lift pin plate 55 is disposed at an upper position (a position where a transportation robot (not shown) transfers target substrate W) by lift driving unit 45 (upper position determining operation). In this case, liquid supplying arm 11 is disposed apart from an upper side of support plate 51.

Next, target substrate W is received from the transportation robot by three lift pins 55a of lift pin plate 55, and a rear surface (bottom surface) of target substrate W is supported by lift pins 55a (receiving operation).

Next, lift pin plate 55 is disposed at a lower position (a position where target substrate W is processed by, for example, chemical liquids) by lift driving unit 45 (lower position determining operation) (see, for example, FIG. 2).

While lift pin plate 55 is disposed at the lower position, substrate main body $W_i$ of target substrate W is held and supported by support portion 57 of support plate 51 (supporting operation) (see FIG. 2). In this case, target substrate W is disposed so that convex portions $W_m$ are disposed at an upper side and substrate main body W, is disposed at a lower side (see, for example, FIG. 1B).

In this case, liquid supplying arm 11 is moved horizontally about pivot shaft 12 by liquid supplying arm moving unit 13 to be disposed above target substrate W.

Next, target substrate W held and supported by support portion 57 of support plate 51 is rotated by rotating rotational shaft 52 by motor 41 (rotation operation) (see, for example, arrow A in FIG. 3). While target substrate W is rotated, the following operations are performed.

Figure 5A:
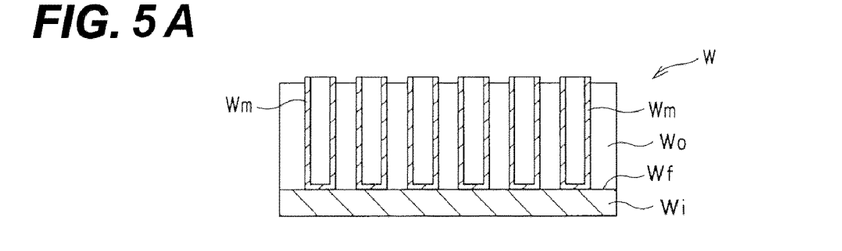
FIG. 5A-5E is a schematic cross-sectional view illustrating a state of a target substrate in each operation of a liquid processing method according to an exemplary embodiment of the present disclosure.
Figure 5B:
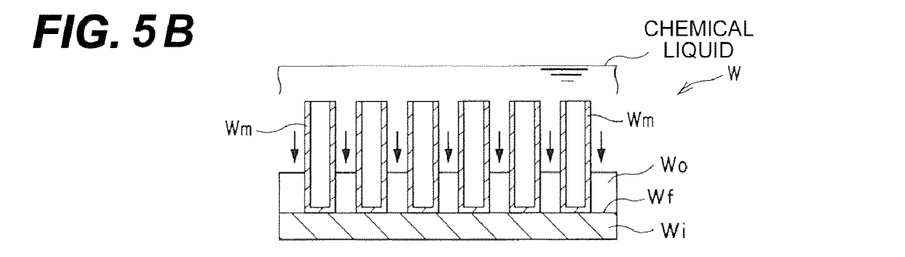
Figure 5C:
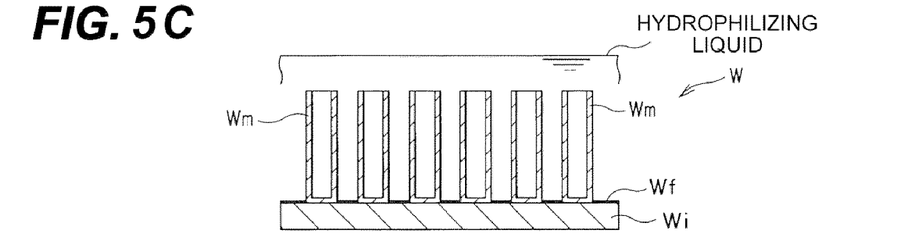
Figure 5D:
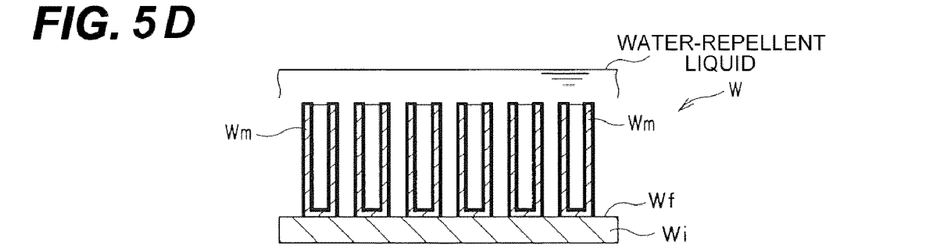
Figure 5E:
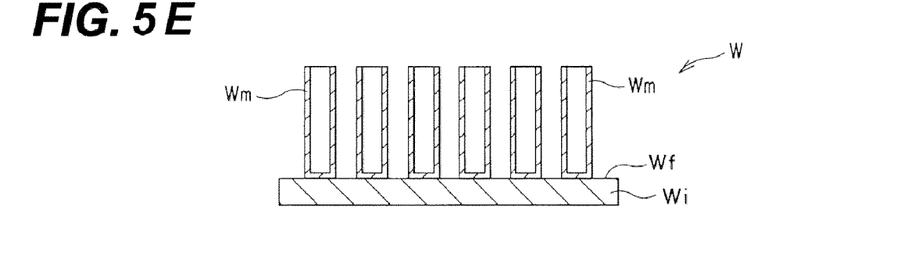

In target substrate W, an oxide film $W_o$ made of, for example, $SiO_2$ is originally formed between the plurality of convex portions $W_m$ on substrate main body $W_i$ (see, for example, FIG. 5A).

Figure 4:
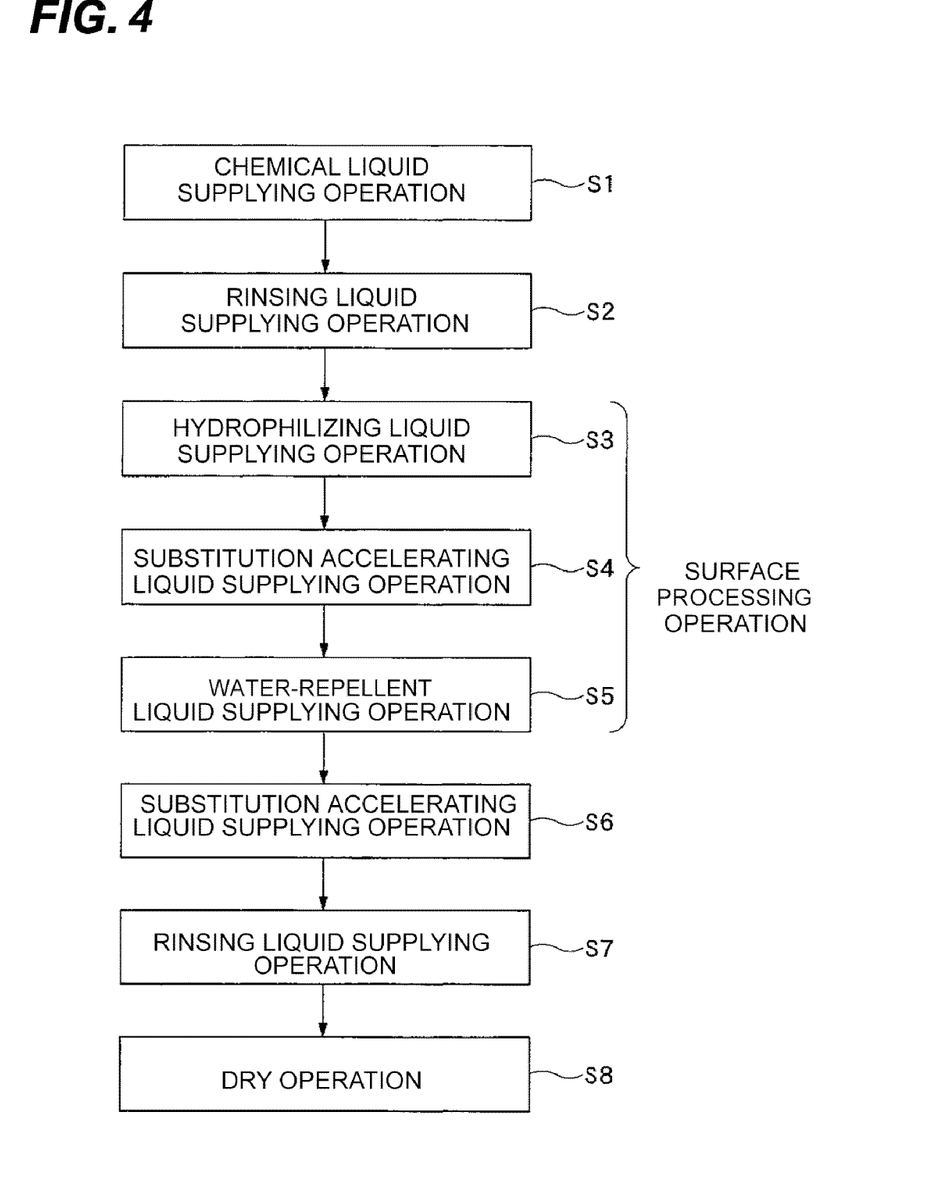
FIG. 4 is a flowchart illustrating a liquid processing method according to an exemplary embodiment of the present disclosure.

First of all, a chemical liquid is supplied to target substrate W by chemical liquid supplying mechanism 20 (chemical liquid supplying operation S1) (see, for example, FIGS. 3 and 4). By this, oxide film $W_o$ formed on substrate main body $W_i$ of target substrate W is selectively etched and removed (see, for example, FIG. 5B).

Next, a rinsing liquid is supplied to the surface of target substrate W from rinsing liquid supplying mechanism 25 after supplying the chemical liquid by chemical liquid supplying mechanism 20 (rinsing liquid supplying process S2) (see, for example, FIGS. 3 and 4). As such, the rinsing liquid is supplied to target substrate W to stop the reaction of the chemical liquid in target substrate W and remove the chemical liquid.

Next, a hydrophilizing liquid is supplied to the surface of target substrate W from hydrophilizing liquid supplying mechanism 71 of surface processing mechanism 70 (hydrophilizing liquid supplying operation S3) (see, for example, FIGS. 3 and 4). By this, water-repellent base surface $W_f$ of target substrate W (for example, SiN) is selectively hydrophilized (see bold lines in FIG. 5C). When base surface $W_f$ of target substrate W is hydrophilized by the operation, the contact angle between the rinsing liquid and base surface $W_f$ may be 80° or more, and may in particular be 90° or more.

Next, a substitution accelerating liquid for substituting the hydrophilizing liquid with a water-repellent liquid is supplied to the surface of target substrate W from substitution accelerating liquid supplying mechanism 30 after supplying the hydrophilizing liquid from hydrophilizing liquid supplying mechanism 71 (substitution accelerating liquid supplying operation S4) (see, for example, FIGS. 3 and 4). Before substitution accelerating liquid supplying operation S4, a rinsing liquid may be supplied to the surface of target substrate W from rinsing liquid supplying mechanism 25 (rinsing liquid supplying operation).

Next, a water-repellent liquid is supplied to the surface of target substrate W from water-repellent liquid supplying mechanism 75 of surface processing mechanism 70 (water-repellent liquid supplying operation S5) (see, for example, FIGS. 3 and 4). By this, in target substrate W, the surfaces of hydrophilized convex portions $W_m$ (for example, TiN) become are selectively water-repellent (see the bold lines in FIG. 5D). In this case, base surface $W_f$ of target substrate W remains hydrophilized. When the surfaces of convex portions $W_m$ of target surface W become water-repellent by the operation, the contact angle between the rinsing liquid and convex portion $W_m$ may be 30° or less, may in particular be 20° or less, and may in particular be 10° or less.

As such, base surface $W_f$ of target substrate W is selectively hydrophilized by hydrophilizing liquid from hydrophilizing liquid supplying mechanism 71 and the surfaces of convex portions $W_m$ become are selectively water-repellent by the water-repellent liquid from water-repellent liquid supplying mechanism 75. In the exemplary embodiment, the surface processing operation includes hydrophilizing liquid supplying process S3 and water-repellent liquid supplying operation S5.

Subsequently, a substitution accelerating liquid for substituting the water-repellent liquid with a rinsing liquid is supplied to the surface of target substrate W from substitution accelerating liquid supplying mechanism 30 after supplying the water-repellent liquid by water-repellent liquid supplying mechanism 75 (substitution accelerating liquid supplying operation S6) (see, for example, FIGS. 3 and 4).

Next, the rinsing liquid is supplied to the surface of target substrate W from rinsing liquid supplying unit 26 (rinsing liquid supplying operation S7) (see, for example, FIGS. 3 and 4).

Convex portions $W_m$ of target substrate W are protected from being exposed from liquid surfaces while chemical liquid supplying operation S1 to rinsing liquid supplying operation S7 are performed.

Thereafter, the supply of the rinsing liquid from rinsing liquid supplying unit 26 is stopped and the rotation speed of motor 41 is increased to rotate substrate holding mechanism 50, such that target substrate W is dried (dry operation S8). By this, the rinsing liquid is removed from the surface of target substrate W (see, for example, FIG. 5E).

As a result, since target substrate W is exposed from a liquid surface of the rinsing liquid, but the surfaces of convex portions $W_m$ become water-repellent for the rinsing liquid, the surface tension applied between convex portions $W_m$ can be reduced, thereby preventing convex portions $W_m$ from collapsing. Since base surface $W_f$ of target substrate W is hydrophilized for the rinsing liquid, it is possible to prevent a portion where the rinsing liquid is dried and a portion wet with the rinsing liquid from coexisting on the surface of target substrate W, thereby preventing convex portions $W_m$ from collapsing.

As described above, while target substrate W is rotated and dried, liquid supplying arm 11 is moved horizontally about pivot shaft 12 by liquid supplying arm moving unit 13, and consequently, is disposed at a location apart from the upper side of target substrate W.

Next, the rotation of motor 41 is stopped to stop a rotation of target substrate W (see, for example, FIG. 3). Next, lift pin plate 55 is disposed at the upper position by lift driving unit 45 to lift target substrate W by lift pins 55a (upper position determining operation). Thereafter, target substrate W is received and carried out by the transportation robot (carrying-out operation).

As described above, according to the exemplary embodiment, base surface $W_f$ of target substrate W is hydrophilized and the surfaces of convex portions $W_m$ become water-repellent by supplying the hydrophilizing liquid and the water-repellent liquid to target substrate W (hydrophilizing liquid supplying operation S3 and water-repellent liquid supplying process S5) before supplying the rinsing liquid (rinsing liquid supplying operation S7). By this, it is possible to prevent the surface tension from being applied between convex portions $W_m$. Additionally, it is possible to prevent the portion where the rinsing liquid is dried and the portion wet with the rinsing liquid from coexisting on the surface of target substrate W when the rinsing liquid is dried and removed from target substrate W, thereby preventing the collapse of convex portions $W_m$ caused by imbalance of the surface tension of the rinsing liquid applied to convex portions $W_m$.

Figure 6A:
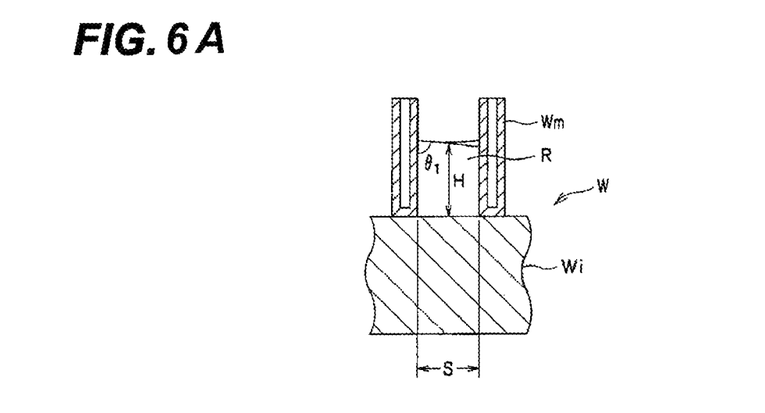
FIG. 6A-6C is a lateral cross-sectional view illustrating a principle that explains the collapse of convex portions of a target substrate.

Specifically, when rinsing liquid R exists between convex portions $W_m$, force F causing collapse of convex portions $W_m$ is derived from the following Equation 1 (see, for example, FIG. 6A).

$$F = \frac{2\gamma\cos\theta}{S}HD \quad \text{[Equation 1]}$$

Herein, γ represents an interfacial tension between rinsing liquid R and convex portion $W_m$, $\theta(\theta_1)$ represents an inclination angle of rinsing liquid R to the surface of convex portion $W_m$, H represents the height of the liquid surface of rinsing liquid R between convex portions $W_m$, D (not shown) represents a depth of convex portion $W_m$, and S represents a gap between convex portions $W_m$ (see, for example, FIG. 6A).

Figure 6B:
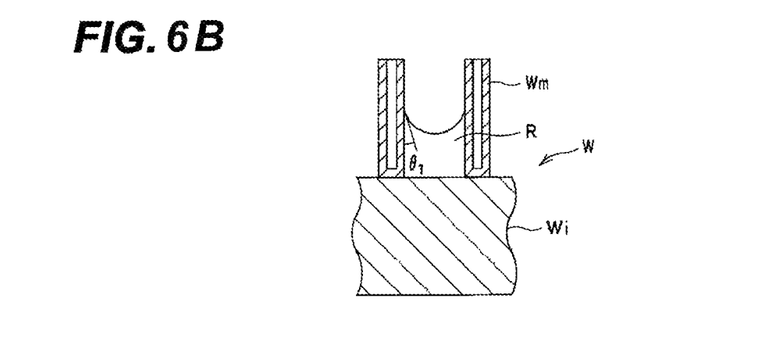
Figure 6C:
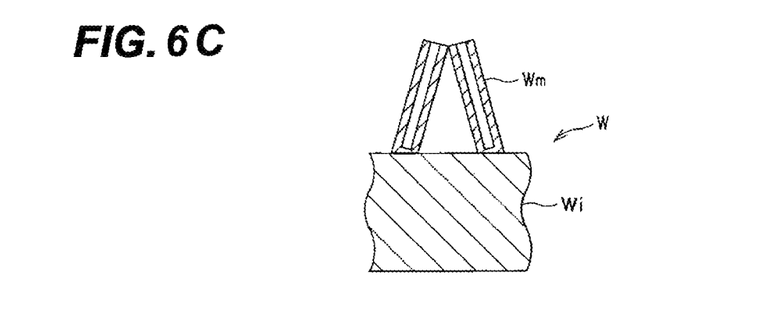

When the surfaces of convex portions $W_m$ are not water-repellent, rinsing liquid R is pulled to convex portions $W_m$ and inclination angle θ1 decreases (cos θ1 increases) as shown in FIG. 6B. As a result, force F to collapse convex portions $W_m$ increases and convex portions $W_m$ collapse (see, for example, FIG. 6C).

Based on the facts, in the exemplary embodiment, since the surfaces of convex portions $W_m$ become water-repellent by the water-repellent liquid, inclination angle $\theta_1$ of rinsing liquid R to the surface of convex portion $W_m$ can be maintained at 80° or more or 90° or more (see, for example, FIG. 6A) while substrate W is dried, thereby reducing force F. Therefore, it is possible to prevent convex portions $W_m$ from collapsing.

In the exemplary embodiment, since base surface $W_f$ of target substrate W is hydrophilized, the interfacial tension of hydrophilized base surface $W_f$ becomes large and the rinsing liquid can be kept spread on base surface $W_f$ of target substrate W. By this, when the rinsing liquid is dried and removed from target substrate W (dry operation S8), a liquid film of the rinsing liquid spreads on hydrophilized base surface $W_f$. While the liquid film of the rinsing liquid is spread, target substrate W can be dried so that the liquid film becomes gradually thinner.

Figure 7:
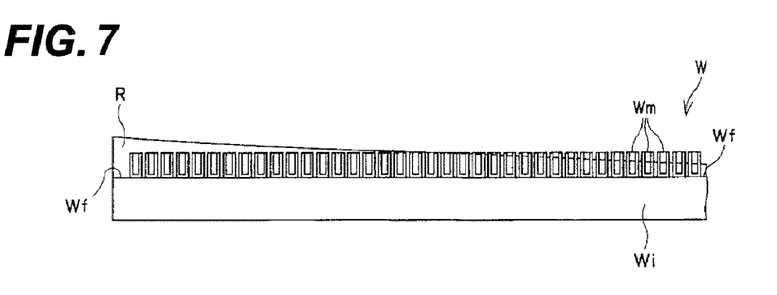
FIG. 7 is a schematic cross-sectional view illustrating a target substrate when a rinsing liquid is dried and removed from the target substrate.

FIG. 7 is a schematic cross-sectional view illustrating the surface of target substrate W when the rinsing liquid is dried and removed (dry operation S8) as described above. In FIG. 7, a right side corresponds to the center of target substrate W and a left side corresponds to a periphery of target substrate W (similarly as in FIG. 14 to be described below).

As described in FIG. 7, since base surface $W_f$ of target substrate W is hydrophilized, the liquid film of rinsing liquid R spreads all over base surface $W_f$ of target substrate W and a portion with dried rinsing liquid R and a portion wet with rinsing liquid R do not coexist on the surface of target substrate W. Therefore, it is possible to prevent the collapse of convex portions $W_m$ caused by imbalance of the surface tension of rinsing liquid R which is applied to convex portions $W_m$. Even though the liquid film of rinsing liquid R becomes thin at the center of target substrate W and thick at the periphery by centrifugal force when target substrate W is rotated, a difference in thickness of the liquid film between convex portions $W_m$ is negligible, such that the convex portions $W_m$ collapsing phenomenon does not occur.

As described above, since the surfaces of convex portions $W_m$ become water-repellent by water-repellent liquid (water-repellent liquid supplying operation S5), even though the force causing collapse of convex portions $W_m$ is generated by the difference in the method of removing rinsing liquid R, the force is negligible, and as a result, convex portions $W_m$ do not collapse.

Figure 14:
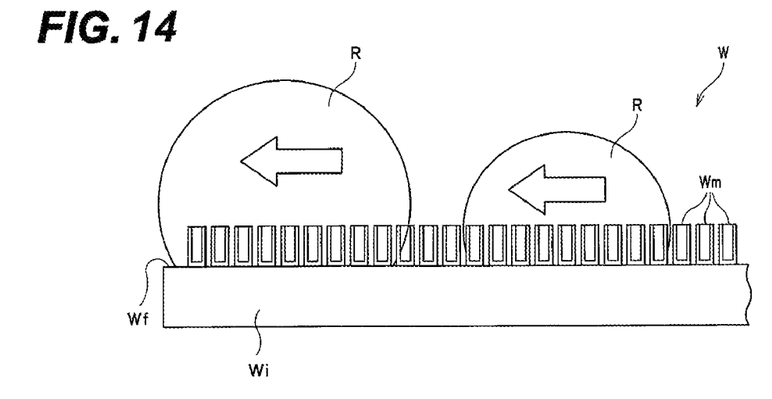
FIG. 14 is a schematic cross-sectional view illustrating a target substrate when a rinsing liquid is dried and removed from the target substrate according to a comparative example.

Meanwhile, as a comparative example shown in FIG. 14, when both of base surface $W_f$ of target substrate W and the surfaces of convex portions $W_m$ become water-repellent, droplets of rinsing liquid R are generated on target substrate W. By this, a portion with rinsing liquid R and a portion without rinsing liquid R coexist on the surface of target substrate W, and the surface tension of rinsing liquid R applied to convex portions $W_m$ loses its balance, and as a result, convex portions $W_m$ are in danger of collapsing. Since the droplets of rinsing liquid R move from the center of target substrate W toward the periphery thereof (see an arrow in FIG. 14), the same location of target substrate W is repeatedly dried and wet with rinsing liquid R, and on those occasions, the surface tension is applied to convex portions $W_m$. Consequently, convex portions $W_m$ are in danger of collapsing.

Modified Example

Hereinafter, each modified example of the exemplary embodiment is described with reference to FIGS. 8 to 13. In FIGS. 8 to 13, like reference numerals refer to like elements in the exemplary embodiment shown in FIGS. 1 to 7 and detailed descriptions thereof are omitted.

Figure 8:
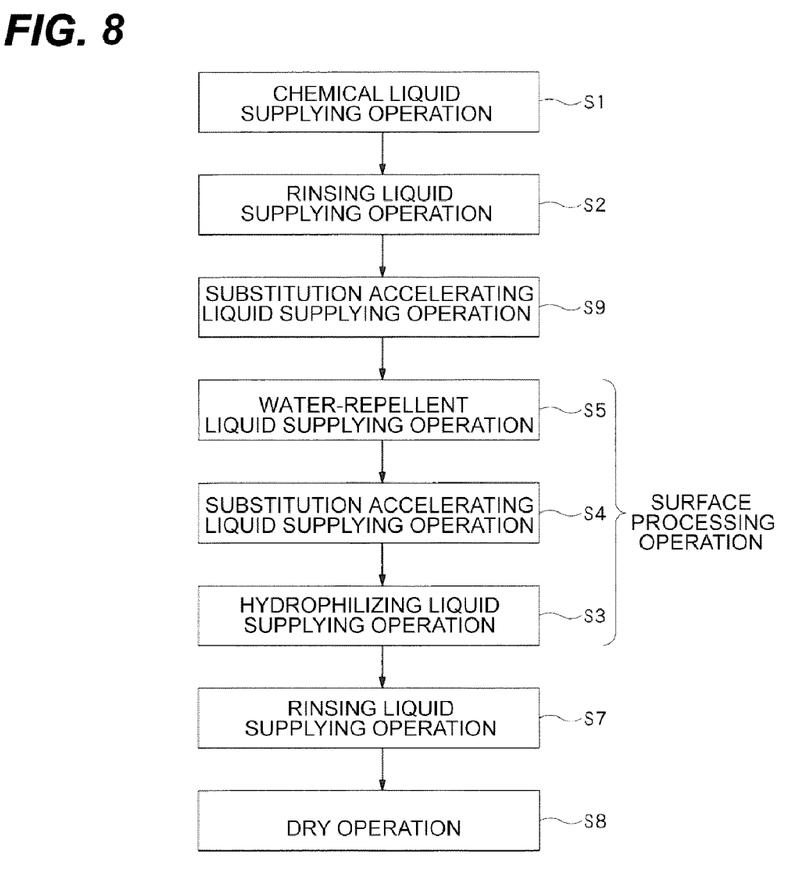
FIG. 8 is a flowchart illustrating a liquid processing method according to a modified example of an exemplary embodiment of the present disclosure.

As described above, in the surface processing operation, water-repellent liquid supplying operation S5 is performed after hydrophilizing liquid supplying operation S3, but is not limited thereto. Hydrophilizing liquid supplying operation S3 may be performed after water-repellent liquid supplying operation S5. That is, as shown in FIG. 8, rinsing liquid supplying operation S2, substitution accelerating liquid supplying process S9, water-repellent liquid supplying operation S5, substitution accelerating liquid supplying process S4, hydrophilizing liquid supplying operation S3, and rinsing liquid supplying operation S7 may be performed in sequence between chemical liquid supplying operation S1 and dry operation S8.

Even in this case, since the hydrophilic surfaces of convex portions $W_m$ may become water-repellent by the water-repellent liquid and water-repellent base surface $W_f$ may be hydrophilized by the hydrophilizing liquid, it is possible to prevent convex portions $W_m$ from collapsing during dry operation S8.

Figure 9:
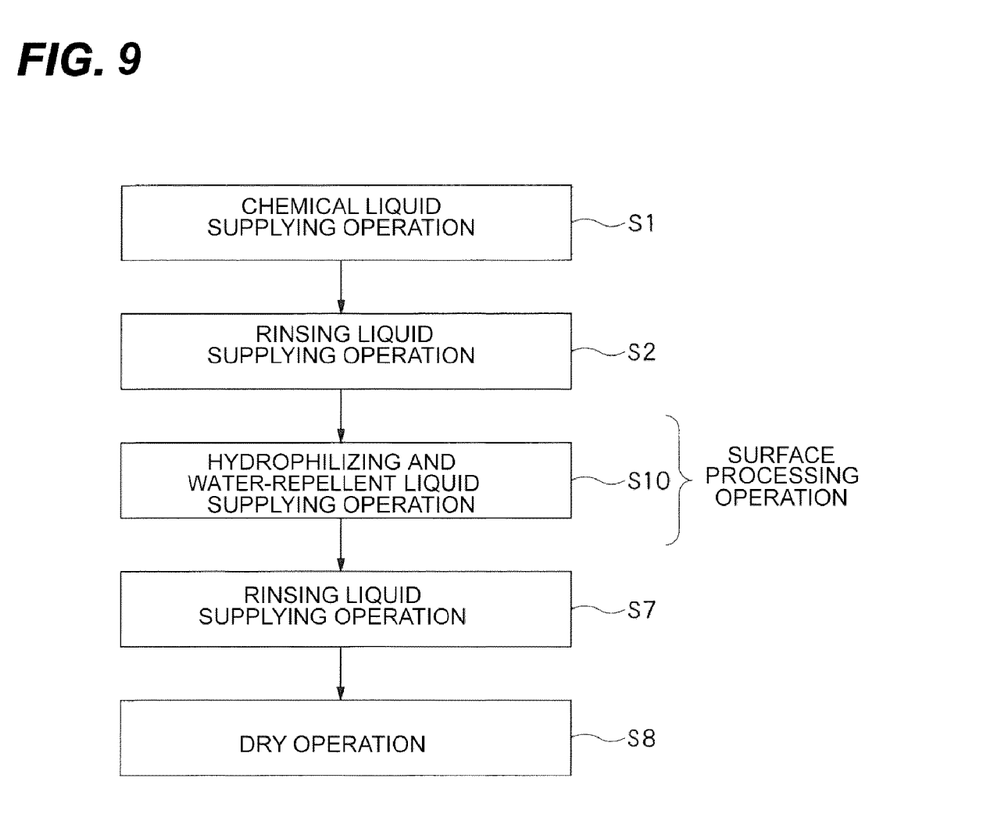
FIG. 9 is a flowchart illustrating a liquid processing method according to another modified example of an exemplary embodiment of the present disclosure.

Hydrophilizing liquid supplying operation S3 and water-repellent liquid supplying operation S5 are not separately performed but hydrophilizing of base surface $W_f$ and the making of the surfaces of convex portions $W_m$ to be water-repellent may be performed simultaneously in the surface processing operation. That is, as shown in FIG. 9, rinsing liquid supplying operation S2, hydrophilizing and water-repellent liquid supplying operation S10 and rinsing liquid supplying operation S7 may be performed in sequence between chemical liquid supplying operation S1 and dry operation S8. In this case, in the surface processing operation, the hydrophilizing and water-repellent liquid is supplied to target substrate W to perform the hydrophilizing of water-repellent base surface $W_f$ and the making of the hydrophilic surfaces of convex portions $W_m$ to be water-repellent simultaneously (hydrophilizing and water-repellent liquid supplying operation S10). A chemical liquid containing, for example, a surfactant may be used as the hydrophilizing and water-repellent liquid.

Figure 10:
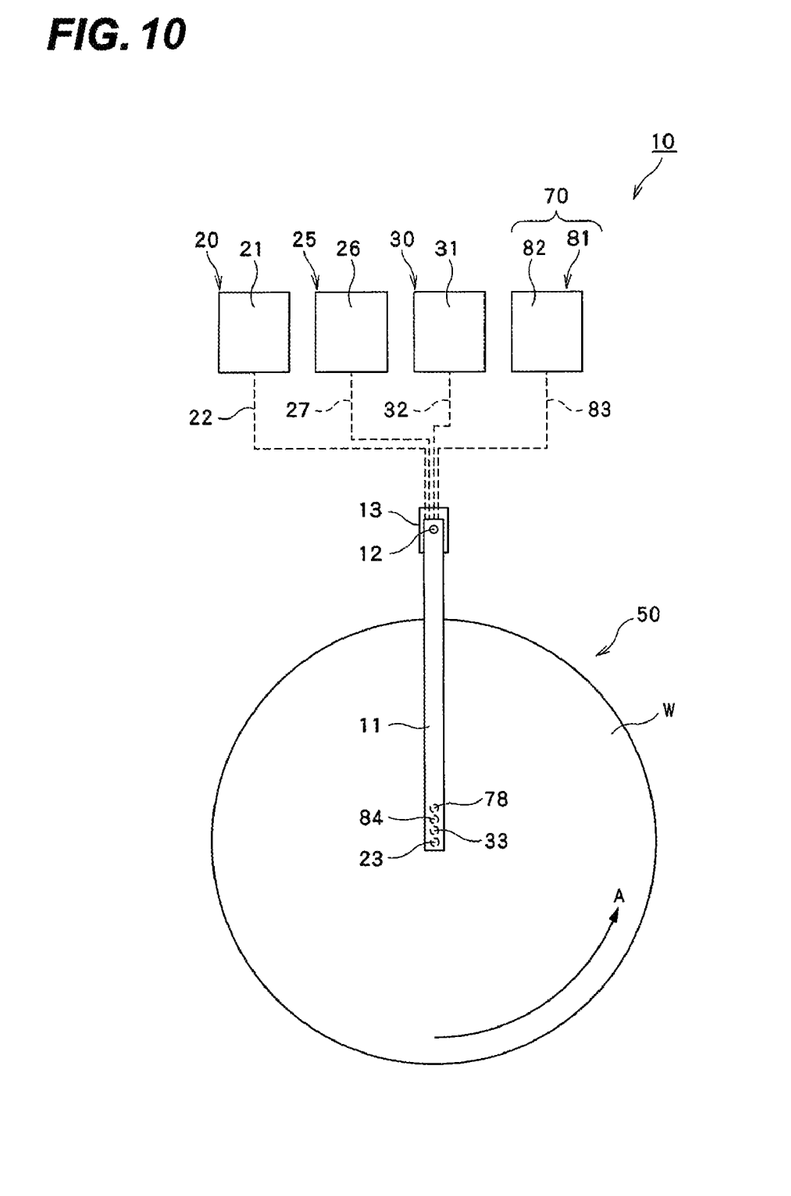
FIG. 10 is a top view illustrating the configuration of a liquid processing apparatus according to a modified example of an exemplary embodiment of the present disclosure.

As described above, when the hydrophilizing and water-repellent water repellentizing liquid is supplied to target substrate W, as shown in FIG. 10, a surface processing mechanism 70 includes a hydrophilizing and water-repellent liquid supplying mechanism 81 for supplying the hydrophilizing and water-repellent liquid to perform hydrophilizing of water-repellent base surface $W_f$ and the making of the hydrophilic surfaces of convex portions $W_m$ to be water-repellent simultaneously. In this case, hydrophilizing and water-repellent liquid supplying mechanism 81 includes a hydrophilizing and water-repellent liquid supplying unit 82 supplying the hydrophilizing and water-repellent liquid, a hydrophilizing and water-repellent liquid supplying pipe 83 guiding the hydrophilizing and water-repellent liquid supplied from hydrophilizing and water-repellent liquid supplying unit 82, and a hydrophilizing and water-repellent liquid supplying nozzle 84 connected to hydrophilizing and water-repellent liquid supplying pipe 83 and installed at an end of liquid supplying arm 11. A portion of hydrophilizing and water-repellent liquid supplying pipe 83 passes through liquid supplying arm 11.

Even in this case, since water-repellent base surface $W_f$ can be selectively hydrophilized and the hydrophilic surfaces of convex portions $W_m$ can become selectively water-repellent by the hydrophilizing and water-repellent liquid, it is possible to prevent convex portions $W_m$ from collapsing during dry operation S8. It is possible to effectively perform hydrophilizing of water-repellent base surface $W_f$ and the making of the hydrophilic surfaces of convex portions $W_m$ to be water-repellent with a single operation.

As described above, base surface $W_f$ of substrate main body $W_i$ is made of the water-repellent material (for example, SiN) and the surface of the material (for example, TiN) of the convex portion $W_m$ has the hydrophilic property, but are not limited thereto.

Figure 11:
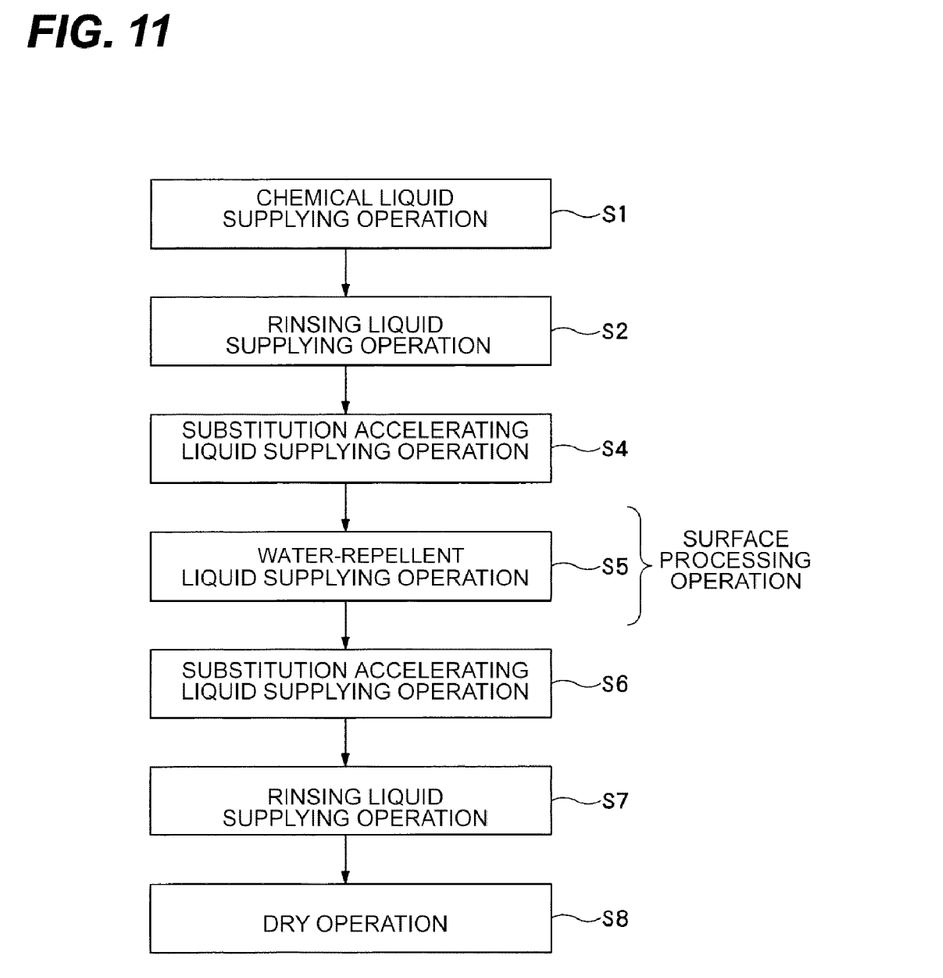
FIG. 11 is a flowchart illustrating a liquid processing method according to yet another modified example of an exemplary embodiment of the present disclosure.

For instance, when the surface of the material of convex portions $W_m$ has the hydrophilic property and base surface $W_f$ of substrate main body $W_i$ is originally made of a hydrophilic material, hydrophilizing liquid supplying operation S3 may be omitted. That is, as shown in FIG. 11, rinsing liquid supplying operation S2, substitution accelerating liquid supplying operation S4, water-repellent liquid supplying operation S5, substitution accelerating liquid supplying operation S6, and rinsing liquid supplying operation S7 may be performed in sequence between chemical liquid supplying operation S1 and dry operation S8. In this case, hydrophilizing liquid supplying mechanism 71 of surface processing mechanism 70 shown in FIG. 3 may be removed.

Figure 12:
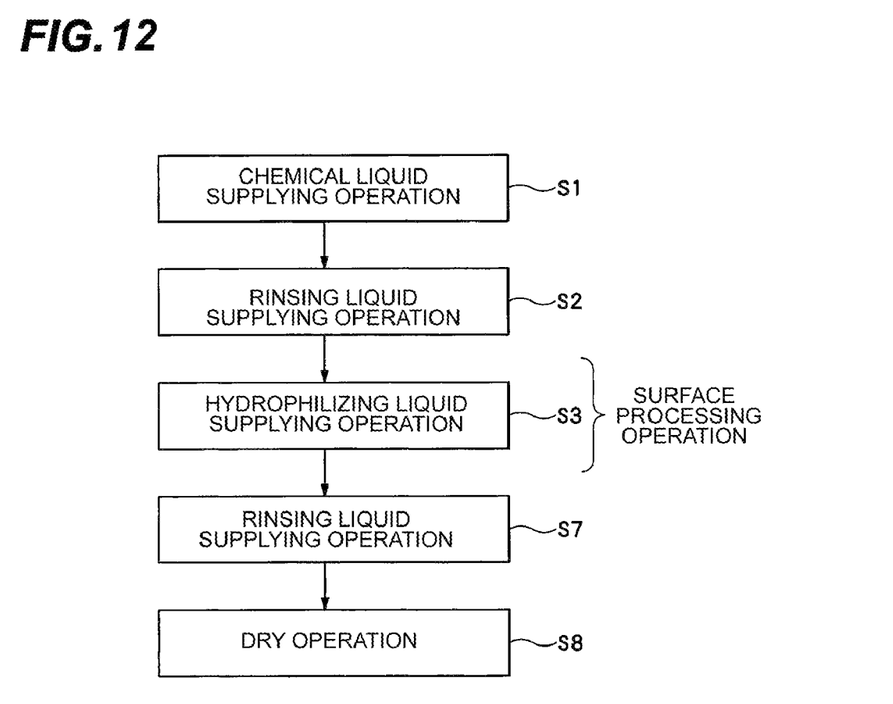
FIG. 12 is a flowchart illustrating a liquid processing method according to still yet another modified example of an exemplary embodiment of the present disclosure.

Alternatively, when base surface $W_f$ of substrate main body $W_i$ is made of a water-repellent material and the surface of convex portion $W_m$ is originally made of water-repellent material, water-repellent liquid supplying operation S5 may be omitted. That is, as shown in FIG. 12, rinsing liquid supplying operation S2, hydrophilizing liquid supplying operation S3 and rinsing liquid supplying operation S7 may be performed in sequence between chemical liquid supplying operation S1 and dry operation S8. In this case, water-repellentizng liquid supplying mechanism 75 of surface processing mechanism 70 shown in FIG. 3 may be omitted.

Figure 13A:
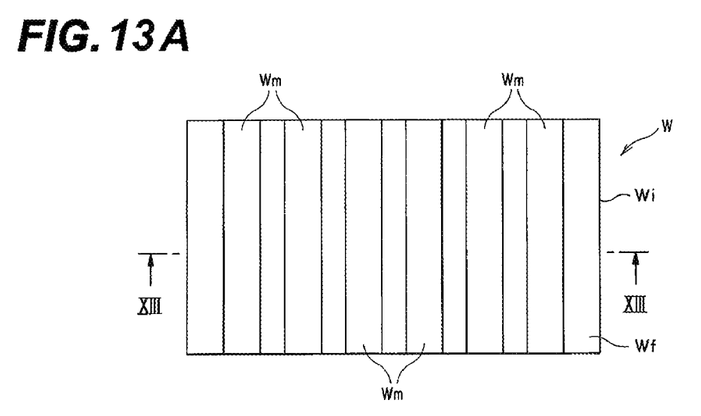
FIG. 13A-13B is a lateral cross-sectional view illustrating another aspect of a target substrate used in an exemplary embodiment of the present disclosure.
Figure 13B:
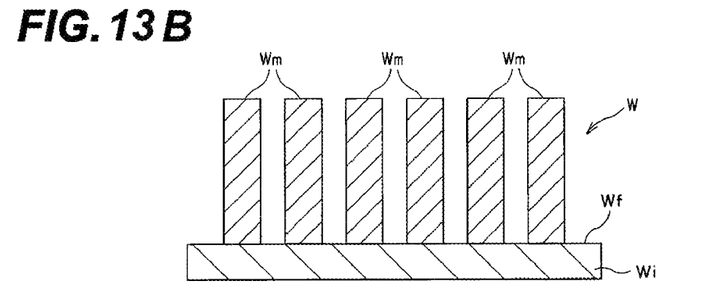

Meanwhile, as described above, each of convex portions $W_m$ of target substrate W has the cylindrical shape (see FIGS. 1A and 1B), but is not limited thereto. For instance, as shown in FIGS. 13A and 13B, each of convex portions $W_m$ of target substrate W may have a thin and long plate shape. Similarly as in target substrate W, it is possible to prevent convex portions $W_m$ from collapsing during dry operation S8. FIG. 13A is a schematic plan view illustrating a part of a target substrate and FIG. 13B is a schematic cross-sectional view (taken along line XIII-XIII of FIG. 13A) illustrating a part of the target substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method of processing an object to be processed which includes a main body, a plurality of convex portions protruding from the main body and a base surface formed between the convex portions on the main body, the method comprising:
   supplying a chemical liquid to the object to be processed;
   supplying a rinsing liquid to the object to be processed thereby removing the chemical liquid from the object to be processed;
   after removing the chemical liquid from the object to be processed, processing a surface of the object to be processed with a chemical liquid containing ozonized water such that the base surface of the object to be processed which is made of a Si-based water-repellent material becomes selectively hydrophilic, and processing the surface of the object to be processed with a water-repellent liquid such that the surfaces of the convex portions each of which is made of a metallic hydrophilic material become selectively water-repellent;

supplying a rinsing liquid to the object to be processed which has been subjected to the surface processing; and removing the rinsing liquid from the object to be processed thereby drying the object to be processed.

2. The method of claim 1, wherein each of the convex portions of the object has a cylindrical shape.

3. The method of claim 1, wherein the surface processing includes supplying the object to be processed with the ozonized water such that the Si-based water-repellent material becomes hydrophilic, and then, supplying the object to be processed with the water-repellent liquid such that the metallic hydrophilic material of the convex portions becomes water-repellent.

4. The method of claim 1, wherein the surface processing includes supplying the object to be processed with the water-repellent liquid such that the metallic hydrophilic material of the convex portions becomes water-repellent, and then, supplying the object to be processed with the ozonized water such that the Si-based water-repellent material becomes hydrophilic.

5. The method of claim 1, wherein the water-repellent liquid is selected from the group consisting of a silylation agent, dimethyl (dimethylamino) silane (DMSDMA), 1,1,3,3-tetramethyl disilane (TMDS), hexamethyldisilazane (HMDS), a chemical liquid containing fluoric polymer, and a chemical liquid containing a surfactant.

6. The method of claim 1, wherein the Si-based water-repellent material is a selected one of SiN, Si and SiO2, and the metallic hydrophilic material is selected one of TiN, W, Hf, and Poly-Si.

7. A non-transitory computer readable recording medium storing a computer program for controlling a liquid processing apparatus to execute a liquid processing method that processes an object to be processed including a main body, a plurality of convex portions protruding from the main body, and a base surface formed between the convex portions on the main body, the method comprising:

supplying a chemical liquid to the object to be processed;

supplying a rinsing liquid to the object to be processed thereby removing the chemical liquid from the object to be processed;

after removing the chemical liquid from the object to be processed, processing a surface of the object to be processed with a chemical liquid containing ozonized water such that the base surface of the object to be processed which is made of a Si-based water-repellent material becomes selectively hydrophilic, and processing the surface of the object to be processed with a water-repellant liquid such that the surfaces of the convex portions each of which is made of a metallic hydrophilic material become water-repellent;

supplying a rinsing liquid to the object to be processed which has been subjected to the surface processing; and removing the rinsing liquid from the object to be processed thereby drying the object to be processed.

* * * * *